Figure 1:
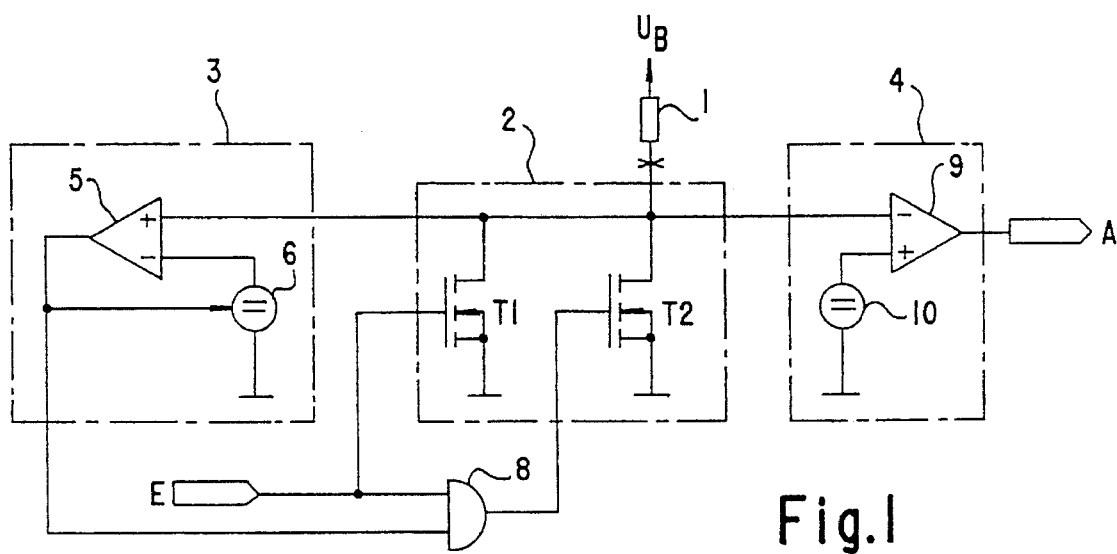

United States Patent [19]

Allmeier et al.

[11] Patent Number: 5,570,259
[45] Date of Patent: Oct. 29, 1996

[54] CIRCUIT ARRANGEMENT FOR CONTROLLING A LOAD AND FOR RECOGNIZING A LINE INTERRUPTION

[75] Inventors: Franz Allmeier, Mintraching; Theodor Maier, Aiglsbach; Gerhard Goeser, Pentling, all of Germany; Donald Preslar, Ringoes, N.J.; Philip Murphy, München, Germany

[73] Assignees: Siemens Aktiengesellschaft; Harris Semiconductor GmbH, both of Munich, Germany

[21] Appl. No.: 104,327

[22] Filed: Aug. 9, 1993

[30] Foreign Application Priority Data

Aug. 7, 1992 [EP] European Pat. Off. ............ 92113493

[51] Int. Cl.$^6$ ....................................................... H02H 3/00
[52] U.S. Cl. ................................ 361/86; 361/88; 361/92; 361/115
[58] Field of Search ................................ 361/91, 93, 101, 361/86, 88, 92, 115; 324/96; 307/507, 570, 270; 340/660, 661, 662, 663

[56] References Cited

U.S. PATENT DOCUMENTS

| | | | |
|---|---|---|---|
| 4,375,073 | 2/1983 | Glogolja et al. | 361/91 |
| 5,057,719 | 10/1991 | Niedra | 307/570 |

FOREIGN PATENT DOCUMENTS

| | | |
|---|---|---|
| 3312304 | 10/1984 | Germany . |
| 3907880 | 9/1990 | Germany . |
| 2034550 | 6/1980 | United Kingdom . |

*Primary Examiner*—Jeffrey A. Gaffin
*Assistant Examiner*—Stephen Jackson
*Attorney, Agent, or Firm*—Herbert L. Lerner; Laurence A. Greenberg

[57] ABSTRACT

A circuit arrangement for controlling a load and for recognizing an interruption in a line to the load includes a measuring resistance connected in series with the load, a device for varying a resistance value of the measuring resistance as a function of a current passing through the load, and a diagnostic device for generating a diagnosis signal if a voltage drop, producible across the measuring resistance by a load current drops below a threshold value.

7 Claims, 1 Drawing Sheet

CIRCUIT ARRANGEMENT FOR CONTROLLING A LOAD AND FOR RECOGNIZING A LINE INTERRUPTION

SPECIFICATION

The invention relates to a circuit arrangement for controlling a load and for recognizing an interruption in a line to the load, preferably for use in a motor vehicle.

In a conventional circuit arrangement for controlling a load (published British Patent Application 2 034 550 A), an interruption in a line between the circuit arrangement and the load is recognized when the load is switched on. In this regard, the voltage drop across the circuit arrangement is detected and evaluated. Despite the fact that the load had been switched on, if no load current flows because of a line break, the voltage drop across the circuit arrangement is virtually zero, i.e., the voltage has dropped below a limit value, and a defect or failure is recognized.

The voltage is also nearly zero, however, if only a very small load current flows through the load. Reliable recognition of a line interruption is therefore not possible with circuit arrangements which are used both with low and with high load currents or, in other words, in applications having a broad load-current range.

It is accordingly an object of the invention to provide a circuit arrangement which recognizes, over a wide load current range, an interruption in a line to a load which has been switched on.

With the foregoing and other objects in view, there is provided, in accordance with the invention, a circuit arrangement for controlling a load and for recognizing an interruption in a line to the load, comprising a measuring resistance connected in series with the load, means for varying a resistance value of the measuring resistance as a function of a current passing through the load, and a diagnostic device for generating a diagnosis signal if a voltage drop, producible across the measuring resistance by a load current, drops below a threshold value.

In accordance with another feature of the invention, the resistance-value varying means comprise a change-over device.

In accordance with an alternate feature of the invention, the resistance-value varying means are a regulating device.

Thus, a measuring resistance is divided into several regions. By varying the measuring resistance, the voltage drop across the circuit arrangement, and hence the magnitude of the voltage to be detected are adapted to or matched with the load current. The power loss caused by the load current is therefore quite low.

In accordance with a further feature of the invention, the measuring resistance has at least two field-effect transistors connected in parallel, and has a resistance value determinable by a drain-to-source path of the transistors.

In accordance with an added feature of the invention, the transistors have different drain-to-source resistance values, in a conducting state thereof.

In accordance with an additional feature of the invention, the change-over device is constructed as a comparator subjectible to hysteresis, the comparator having a first input at which a drain-to-source voltage is applied, and a second input at which a first reference voltage is applied.

In accordance with yet another feature of the invention, one of the transistors is thermally coupled with a source of the first reference voltage so as to compensate for temperature drift in the measuring voltage due to heating of the one transistor as a result of a flow of current through the one transistor.

In accordance with yet a further feature of the invention, the diagnostic device comprises a comparator, having a first input at which the drain-to-source voltage is applied, and a second input at which a second reference voltage is applied.

In accordance with a concomitant feature of the invention, the circuit arrangement is embodied as an integrated circuit.

The measuring resistance may be realized by drain-to-source resistances of field effect transistors. A variation in the measuring resistance is effected by turning on and turning off individual transistors, which are arranged parallel to one another.

It is especially advantageous if the drain-to-source resistances are realized with greatly different resistances, so that the voltage to be detected can be adapted better to the respective load current. The voltage drop across the circuit arrangement is accordingly very slight and does not limit the voltage available for the load.

In order not to avoid the production of any oscillation when the measuring resistance is varied by changing or switching over the resistance, a change-over device, advantageously with hysteresis, is provided.

The transistors are thermally coupled with the change-over device in order to compensate for the effects of temperature resulting from the flow of load current through the transistors. In this regard, it is desirable for the circuit arrangement to be embodied as an integrated circuit.

Other features which are considered as characteristic for the invention are set forth in the appended claims.

Although the invention is illustrated and described herein as embodied in a circuit arrangement for controlling a load and for recognizing a line interruption, it is nevertheless not intended to be limited to the details shown, since various modifications and structural changes may be made therein without departing from the spirit of the invention and within the scope and range of equivalents of the claims.

Figure 2:
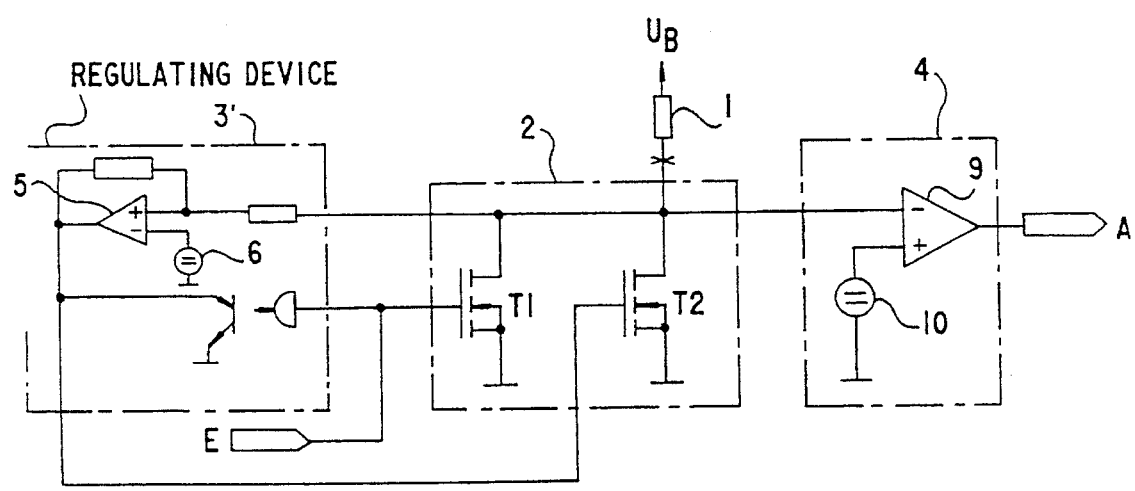

The construction and method of operation of the invention, however, together with additional objects and advantages thereof will be best understood from the following description of specific embodiments when read in connection with the figures of the drawing, in which:

FIG. 1 is a basic circuit diagram of one embodiment of the circuit arrangement according to the invention; and FIG. 2 is a basic circuit diagram of another embodiment of the circuit arrangement.

Referring now to the drawing and, first, particularly to FIG. 1 thereof there is shown therein, a circuit diagram of one embodiment of the circuit arrangement according to the invention which may be used as a driver stage for engine controls in motor vehicles. A load 1, such as the coil of an electromagnetically controlled injection valve, for example, is turned on or off by a non-illustrated control unit, via the circuit arrangement through the input E thereof. In this regard, the circuit arrangement is used as a low-side driver, which means that the load 1 is connected at one end to the supply voltage $U_B$ and at the other to the circuit arrangement, hereinafter called the driver stage.

The driver stage has a measuring resistance 2, which is realized by drain-to-source paths of two field effect transistors T1 and T2 which are connected in parallel. The measuring resistance 2 represents the total resistance of the parallel circuit of the drain-to-source resistances of the transistors T1 and T2.

The load 1 is turned on or off, as aforementioned, by a non-illustrated control unit via the input E of the circuit arrangement, i.e., the gate terminals of the transistors T1 and T2 are controlled by the control unit. The source terminals of the transistors T1 and T2 are each connected to ground, and the drain terminals are connected to the load 1.

A voltage drop across the transistors T1 and T2 caused by a flow of load current through the transistors is detected by a change-over device 3 and a diagnostic device 4. The change-over device 3 has a first comparator 5 and a first reference voltage source 6. The voltage (hereinafter called the measuring voltage) which exists between the measuring resistance 2 and the load 1 is compared with a first reference voltage (threshold value S1) generated by a reference voltage source 6. An output signal of the first comparator 5 controls both the reference voltage source 6, thereby adjusting the threshold value S1, as well as an AND gate 8 which, in turn, switches the transistor T1 on or off.

The diagnostic device 4 has a second comparator 9 and a second reference voltage source 10. The measuring voltage is compared with a second reference voltage (threshold value S2) generated by the reference voltage source 10. Upon the occurrence of an interruption in the line to the load 1 (represented by an X in the drawing), a diagnosis signal is transmitted from an output A of the circuit arrangement.

The control of voltage sources has become quite well known in terms of electronics from, for example, "Hallucinate-Schaltungstechnik" (Semiconductor Circuitry), Controlled Sources with Current Mirrors, by Tietze and Schenk, and therefore does not have to be described in detail herein.

The circuit arrangement for recognizing a line interruption functions in accordance with the principle of current measurement with a shunt. With the driver stage turned on, the voltage established across the measuring resistance 2 due to the flow of current through the load 1, hereinafter called the measuring voltage, is detected and compared with the threshold values S1 and S2.

In order to enable a reliable recognition of a line interruption over a great range of load currents, the measuring resistance 2 is divided into a plurality of resistance ranges; that is, the resistance is varied, in accordance with or as a function of the load current, so that a sufficiently large voltage drop is produced across the measuring resistance 2, both for a low as well as a high load current.

In the exemplary embodiment of the instant application, two different resistance values of the measuring resistance 2 may be established. To that end, the measuring resistance 2 is constructed so that the resistance value thereof is much greater at a low load current than at a high load current. The measuring voltage which is established is compared with the two threshold values S1 and S2, with the following relationship applying:

$$U_B > S1 > S2 > 0 \text{ V}$$

The variation in the measuring resistance 2 is controlled by the change-over device 3, and indeed, whenever the measuring voltage drops below the first threshold value S1, for example, in the case of a low load current which has produced a small voltage drop across the measuring resistance 2. The measuring resistance 2 is switched over from a low resistance value to a high one, inasmuch as the transistor T2 is blocked. The measuring voltage remains higher than the threshold value S2.

As a side effect, the measuring voltage increases again and would then be greater than the threshold value S1 if the threshold value S1 had not been increased with the change in resistance. Otherwise, this would have resulted in an oscillation of the circuit arrangement. This characteristic of the change-over device 3 may also be called hysteresis. The first threshold value S1, which is determined by the first reference voltage source 6, is therefore increased.

In the event of an unintentional interruption in the line to the load 1, only a very slight residual current, which is determined only by input currents to the comparators 5 and 9, then flows through the measuring resistance 2. The measuring voltage is therefore virtually 0 V. The second threshold value S2, which is determined by the second reference voltage source 10, is set so that it then lies reliably above the measuring voltage, yet is lower than the measuring voltage which is established when the load current is low. If the measuring voltage is lower than the threshold value S2, a diagnosis signal is generated in the diagnostic device 4, and is transmitted via the output A to a non-illustrated evaluation unit.

If the measuring resistance 2 is embodied by field effect transistors T1 and T2, the measuring resistance value is then determined by the drain-to-source resistance of the transistors T1 and T2. It is especially advantageous for the drain-to-source resistances to be constructed highly different from one another, so that the circuit arrangement can be used in applications with a broad load-current range.

The first transistor T1 has a drain-to-source resistance in the conducting state of approximately 3 ohms, and that of the second transistor T2 is approximately 0.3 ohms. At high load currents, the effective resistance value is determined by the parallel circuit of the transistors T1 and T2, and is, accordingly, approximately 0.27 ohms and, at low load currents, the effective resistance value is determined only by the transistor T1 at approximately 3 ohms, because the transistor T2 is blocked and then has a very high drain-to-source resistance.

In a state of rest or quiescence, i.e., when no load current is supposed to flow, both transistors T1 and T2 are blocked.

If a load current flows, both transistors T1 and T2 are initially conducting, and the load current is distributed to them in accordance with their drain-to-source resistance. If the load current exceeds a given magnitude, however, the measuring voltage becomes less than the threshold value S1. Consequently, via the output of the comparator 5 and via the AND gate 8, the transistor T2 is blocked, whereas the transistor T1 continues to conduct.

The circuit arrangement may be embodied as an integrated circuit (IC). In such an IC, the various drain-to-source resistance values may be realized, for example, by providing transistors having surface areas of different size.

In an IC, it is also advantageous to compensate for a drift in the measuring voltage caused by temperature variation in the transistors T1 and T2 by placing the first reference voltage source 6 in the vicinity of the transistors T1 and T2, so that the threshold value will also undergo a temperature drift in the same direction.

It is especially advantageous to use D-MOSFET transistors for the transistors T1 and T2. Furthermore, more than two transistors may be connected in parallel. The resulting subcircuit then corresponds to a measuring resistance 2 having more than one resistance stage, and these stages can be turned on as a function of or in accordance with a load current.

In a further exemplary embodiment shown in FIG. 2, wherein the components having a like function as that of corresponding components in the embodiment illustrated in FIG. 1 are identified by the same reference characters as are applied to the components shown in FIG. 1, the change-over device 3 together with the AND gate 8 of FIG. 1 is replaced by a conventional regulating device 3'. The measuring resistance 2 is not connected in stages but rather is regulated continuously. By means of the regulating device 3', the measuring voltage is regulated to a constant value via the voltage at the gate terminals of the transistors T1 and T2.

We claim:

1. A circuit arrangement for controlling a load and for recognizing an interruption in a line to the load, comprising a measuring resistance connected in series with the load, means for varying a resistance value of said measuring resistance as a function of a current passing through the load, and a diagnostic device for generating a diagnosis signal if a voltage drop, producible across said measuring resistance by a load current, drops below a threshold value, said measuring resistance having at least two field-effect transistors connected in parallel, and a resistance value determinable by a drain-to-source path of said transistors, said transistors having different drain-to-source resistance values, in a conducting state thereof, and wherein said change-over device is constructed as a comparator subjectible to hysteresis, said comparator having a first input at which a drain-to-source voltage is applied, and a second input at which a first reference voltage is applied.

2. The circuit arrangement of claim 1, wherein said resistance-value varying means comprise a change-over device.

3. The circuit arrangement of claim 1, wherein said resistance-value varying means are a regulating device.

4. The circuit arrangement of claim 1, wherein one of said transistors is thermally coupled with a source of said first reference voltage so as to compensate for temperature drift in said measuring voltage due to heating of said one transistor as a result of a flow of current through said one transistor.

5. The circuit arrangement of claim 1, which is embodied as an integrated circuit.

6. A circuit arrangement for controlling a load and for recognizing an interruption in a line to the load, comprising a measuring resistance connected in series with the load, means for varying a resistance value of said measuring resistance as a function of a current passing through the load, and a diagnostic device for generating a diagnosis signal if a voltage drop, producible across said measuring resistance by a load current, drops below a threshold value, said measuring resistance having at least two field-effect transistors connected in parallel, and a resistance value determinable by a drain-to-source path of said transistors, said transistors having different drain-to-source resistance values, in a conducting state thereof, and wherein said diagnostic device comprises a comparator, having a first input at which said drain-to-source voltage is applied, and a second input at which a second reference voltage is applied.

7. A circuit arrangement for controlling a load and for recognizing an interruption in a line to the load, comprising:

a measuring resistance connected in series with the load;

a change-over device including a comparator, said comparator of said change-over device having inputs receiving a voltage drop across said measuring resistance and a first reference voltage threshold value, said change-over device varying a resistance value of said measuring resistance and the first reference voltage threshold value to a greater value when a voltage produced across said measuring resistance by a load current falls below the first reference voltage threshold value; and a diagnostic device including a comparator, said comparator of said diagnostic device having inputs receiving the voltage drop across said measuring resistance and a second reference voltage threshold value, said diagnostic device issuing a diagnosis signal if the voltage produced across said measuring resistance by the load current falls below the second reference voltage threshold value.

\* \* \* \* \*